(12) United States Patent
Naviasky et al.

(10) Patent No.: US 6,331,833 B1
(45) Date of Patent: Dec. 18, 2001

(54) HIGHLY LINEAR SIGMA-DELTA MODULATOR HAVING GRACEFUL DEGRADATION OF SIGNAL-TO-NOISE RATIO IN OVERLOAD CONDITION

(75) Inventors: Eric H. Naviasky, Ellicott City; Michael M. Hufford, Catonsville; Jeremy Lubkin, Baltimore, all of MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/488,660

(22) Filed: Jan. 20, 2000

Related U.S. Application Data (60) Provisional application No. 60/133,175, filed on May 7, 1999.

(51) Int. Cl.[7] .............................. H03M 1/06; H03M 3/00
(52) U.S. Cl. ............................................ 341/143; 341/118
(58) Field of Search ................................... 341/155, 143, 341/118, 120, 110, 154; 327/65

(56) References Cited

U.S. PATENT DOCUMENTS

| | | | |
|---|---|---|---|
| 5,274,375 | * 12/1993 | Thompson | 341/143 |
| 5,621,408 | * 4/1997 | Cake et al. | 341/143 |
| 6,169,507 | * 1/2001 | Bianchessi et al. | 341/143 |

* cited by examiner

Primary Examiner—Patrick Wamsley
(74) Attorney, Agent, or Firm—Crosby, Heafey, Roach & May (57) ABSTRACT

A multi-bit analog-to-digital converter architecture, which during normal operation behaves like a single-bit converter, thus sharing the high linearity and low distortion properties of the simpler system. When a high input signal is applied, a second bit is triggered and the system behaves like a more complex multi-bit system, providing system stability where a single-bit comparator would overload and the system would become unstable. During normal operation, a single-bit converter is sufficient to stabilize the system. When the input is a large, sustained signal (relative to the full scale of the converter) this single-bit approach is not sufficient to maintain system stability. Thus, if the input to the analog-to-digital converter is close to its maximum or minimum range (implying a large positive or negative input signal) a second bit is triggered, providing stable linearity where the signal-to-noise ratio of a conventional sigma-delta converter would rapidly drop off.

20 Claims, 9 Drawing Sheets

HIGHLY LINEAR SIGMA-DELTA MODULATOR HAVING GRACEFUL DEGRADATION OF SIGNAL-TO-NOISE RATIO IN OVERLOAD CONDITION

CROSS-REFERENCE TO RELATED APPLICATIONS

This patent depends for priority upon U.S. Provisional Patent Application Serial No. 60/133,175, of the same name and inventorship, filed May 7, 1999, which is incorporated herein in its entirety by reference.

BACKGROUND OF THE INVENTION

1. Field of the Invention

The present invention relates generally to the field of analog-to-digital converters, and more specifically to such converters using sigma-delta (also known as delta-sigma) configurations.

2. Description of the Available Art

Converting analog signals to digital signals is accomplished using an analog-to-digital converter (ADC). An ADC circuit may contain a sigma-delta modulator circuit which is used to oversample an analog input signal. A decimation filter is required to follow the sigma-delta modulator circuit to filter and down-sample the digital output signal from the sigma-delta modulator to the Nyquist sample rate with minimal added in-band noise or distortion.

The standard topology for a sigma-delta A/D converter incorporates a low order analog-to-digital converter (ADC) to generate an output bitstream. This bitstream is sent both to a digital decimation filter to produce the final digital output, and to an input digital-to-analog converter (DAC) which, through a feedback loop, adjusts the subsequent output, based on the bitstream value.

The ADC is often implemented with a single comparator, taking the analog input and producing a single-bit digital output. This allows for a simple implementation of both A/D and D/A blocks. This approach becomes more difficult when designing a high order modulator because it is difficult to guarantee stability. This is due in part to overloading a single-bit comparator. As the input signal increases, the loop gain begins to drop rapidly and the system becomes unstable.

In order to avoid the instability associated with high order loops, multi-bit A/D and D/A architectures are normally used. This reduces the stability concerns associated with higher order loops because a system can be made with enough quantization levels such that overload will not occur and there is a graceful performance degradation as the modulator reaches saturation. Unfortunately this typically comes at the expense of a much more complex design, since it is difficult to achieve high linearity and low distortion from a simple multi-bit ADC. In contrast, a single bit ADC is linear by definition, eliminating much of the design effort of a multi-bit approach.

The linearity of an overall A/D conversion is no greater than the linearity of the internal blocks, namely the DAC and ADC. This is not a concern with a one-bit approach as these blocks are inherently linear. In order to stabilize higher order loops, several quantization levels may be required in these internal blocks. This requires a high level of control of the step size in the quantizer, as well as precise matching of components in the DAC which converts the digital output of the quantizer to an analog level added to the system input. Standard, inexpensive CMOS processes do not provide a ready solution to this problem as component matching capabilities are insufficient to achieve the desired linearity.

One available approach to this challenge has been to devise complex architectures to improve linearity beyond what is achievable with conventional design. This usually comes at the expense of more hardware on the integrated circuit.

There are several texts which generally describe sigma-delta data converters and refer to one-bit and multi-bit configurations of such converters. One such text is entitled: "Oversampling Delta-Sigma Data Converters: Theory, Design and Simulation" by J. C. Candy and G. C. Temes, published by IEEE, January, 1992. Another such text is entitled: "Delta-Sigma Converters: Theory, Design and Simulation" by S. R. Norsworthy, R. Schreier and G. C. Temes, published by IEEE, November, 1996. Still another relevant text is entitled: "Analog-to-Digital and Digital-to-Analog Conversion Techniques" by D. F. Hoeschele, Jr., published by John Wiley & Sons, April, 1994 (Second Edition). The relevant content of these prior art publications is within the scope of information available to those having ordinary skill in the pertinent art and is hereby incorporated herein by reference as if fully set forth herein.

SUMMARY OF THE INVENTION

The disclosed invention eliminates much of the concern and expense of device matching by using a multi-bit architecture for the ADC and DAC, but implemented in such a way that during normal operation they behave like single-bit converters, thus sharing the high linearity and low distortion properties of simpler systems. When a high input signal is applied, a second bit is triggered and the system behaves like a more complex multi-bit system. This allows the system to remain stable where an available single-bit converter would overload and the system would become unstable.

The disclosed invention allows the high linearity of a single-bit architecture for the internal ADC and DAC of a sigma-delta data converter to be combined with the increased stability of a multi-bit converter. Graceful performance degradation compared to a single-bit system is also gained as the multi-bit system approaches saturation. Additionally, in a more traditional approach, the modulator coefficients are usually chosen rather conservatively to provide a margin of stability. This lowers the allowable input range for the modulator and thus lowers the achievable signal-to-noise ration (SNR). Since stability is better assured over a wider range of inputs with the inventive approach, the system may be designed to allow larger input signals and thus achieve higher peak signal-to-noise performance. Also, the inventive architecture allows for straightforward fabrication with a standard CMOS process, without the need for complex circuitry to achieve high linearity and low distortion.

During normal operation, an available sigma-delta converter is well within its operating range. Under these conditions a single-bit ADC and DAC are sufficient to remain stable, even with higher order converters. However, when the input is a large, sustained signal (relative to the full scale of the converter), the available single-bit approach is not sufficient to maintain system stability. Thus, in order to take advantage of the linearity of a single-bit approach while compensating for its shortfalls, the converter of the present invention provides a single-bit output during normal operation (that is, the higher order bit remains at logic low), and if the converter is close to its maximum or minimum range (implying a large positive or negative input signal) a second, higher-order bit is triggered. The trip point for the second bit need not be well controlled, as long as it is set outside the normal operation range, thereby simplifying the converter implementation and design. Thus, the second bit will fire during times of high amplitude input signal, insuring stability where the signal to noise ratio of a conventional converter would begin to drop off rapidly. Thus the present invention maintains stability without degrading system performance.

ADVANTAGES OF THE INVENTION

It is therefore a principal advantage of the invention to provide a sigma-delta analog-to-digital converter which operates as a single-bit converter for input analog signals within a selected range of operation and which operates as a multi-bit converter for input analog signals exceeding the selected range of operation.

It is another advantage of the invention to provide a sigma-delta analog-to-digital converter having the linearity of single bit operation during normal conditions when the analog signal input is within a maximum range and having triggered multi-bit operation during abnormal conditions when the analog signal input exceeds the maximum range.

It is still another advantage of the invention to provide a sigma-delta analog-to-digital converter that employs single-bit operation for nominal input signal conditions and triggers multi-bit operation for input signal overload conditions or near-overload conditions.

It is another advantage of the invention to provide an analog-to-digital converter having performance characteristics closer to the theoretically ideal signal-to-noise ratio than available converters, through a simple design having stable performance with multi-bit capability.

It is yet another advantage of the invention to provide an analog-to-digital converter having a multi-bit architecture, but which operates as a highly linear single-bit converter for input signals that occur within a nominal operating range of voltage and which operates as an overload stable multi-bit converter for input signals that occur in excess of the nominal operating range of voltage.

Still another advantage of the present invention is the provision, in an analog-to-digital converter having a sigma-delta configuration, of a converter providing both single-bit and multi-bit operation, the converter comprising a plurality of single-bit comparators, each connected to receive an input signal and one of a plurality of reference signals, the value of each reference signal comprising a pre-determined percentage of an anticipated maximum absolute value of Vin, and logic combining at least two of the outputs of the plurality of single-bit comparators, the converter providing a multi-bit digital output signal indicating whether Vin is within a normal range or above a predetermined percentage of the anticipated maximum absolute value of Vin. The predetermined percentage may be greater than about 0.9, in the range of about 0.75 to 0.99, in the range of about 0.5 to 0.9, or selected to prevent or substantially prevent an overload condition in the converter. The converter is preferably set to operate as a single-bit converter for input analog signal magnitudes up to the predetermined percentage of the maximum, and to operate as a multi-bit converter for input analog signal magnitudes above the predetermined percentage of the maximum.

Yet another advantage of the present invention is the provision, in a sigma-delta analog-to-digital converter for converting an analog input signal having a maximum absolute value $V_{max}$ into a digital representation of the signal level, of a triggering apparatus comprising a first comparator generating a first bit with a first logic state when the input signal is above a selected median level and with a second logic state when the input signal is below the selected median level, and a second comparator generating a second bit with a first logic state when the input signal has an absolute value above a selected level between the median level and $V_{max}$ and with a second logic state when the input signal has an absolute value below the selected level. The ratio of the selected level to $V_{max}$ may be greater than 0.75, greater than about 0.9, within the range of about 0.76 and 0.99, or within the range 0.5 to 0.9. The output signal of the second comparator may be the second bit. Also, the trigger may further comprise a third comparator, the output signal of which is logically combined with the output of the second comparator to provide the second bit. The triggering apparatus level selected preferably prevents or substantially prevents an overload condition in the analog-to-digital converter.

Still another advantage of the present invention is the provision of a method for selecting a second output bit trigger level in a sigma-delta analog-to-digital converter, the converter having a plurality of comparators including a first comparator generating a first bit and a second comparator generating a second bit after the input signal to the analog-to-digital converter exceeds the trigger level, comprising the steps of applying a simulated input signal to the converter, monitoring the condition of the converter while increasing the magnitude of the simulated input signal, noting the magnitude of the simulated input signal when the converter condition begins to reach overload, and setting the trigger level in a manner based upon the magnitude of the noted simulated input signal. Such simulation may be accomplished mathematically or otherwise.

Still another advantage of the present invention is the provision, in an analog-to-digital converter having a sigma-delta configuration including an integrator receiving an analog input signal having maximum levels $+V_{max}$ and $-V_{max}$ and at least one comparator element having a first scale reference to generate a first digital bit in a manner dependent upon whether the magnitude of the analog input signal is above or below the first scale reference, an apparatus comprising a second comparator element having a second scale reference distinct from the first scale reference, and configured to generate a second digital bit in a manner dependent upon the absolute value of the analog input signal exceeding a selected fraction of $\pm V_{max}$, the selected fraction being greater than 0.5.

Yet another advantage of the present invention is the provision of a highly stable analog-to-digital converter having a sigma-delta configuration, the converter comprising an integrator and a multi-bit comparator element including receiving means to receive from the integrator an input signal having a maximum magnitude, first output bit generating means to generate a first bit in a manner dependent upon whether the magnitude of the input signal is above or below a first reference, and second output bit generating means to generate a second bit in a manner dependent upon whether the magnitude of the input signal exceeds a selected fraction of the maximum magnitude. The selected fraction may be any one of 0.5, 0.9, 0.75 to 0.99, and 0.5 to 0.9.

BRIEF DESCRIPTION OF THE DRAWINGS

The aforementioned advantages of the present invention, as well as additional advantages thereof, will be more fully understood hereinafter as a result of a detailed description of a preferred embodiment when taken in conjunction with the following drawings.

FIG. 4, comprising

FIG. 5, comprising FIGS. 5A, 5B, and 5C, provides graphical illustrations of conventional 1-bit ADC operation, conventional 2-bit ADC operation and multi-bit ADC operation in accordance with the disclosed invention.

FIG. 8 comprising

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF A PREFERRED EMBODIMENT

Figure 1:
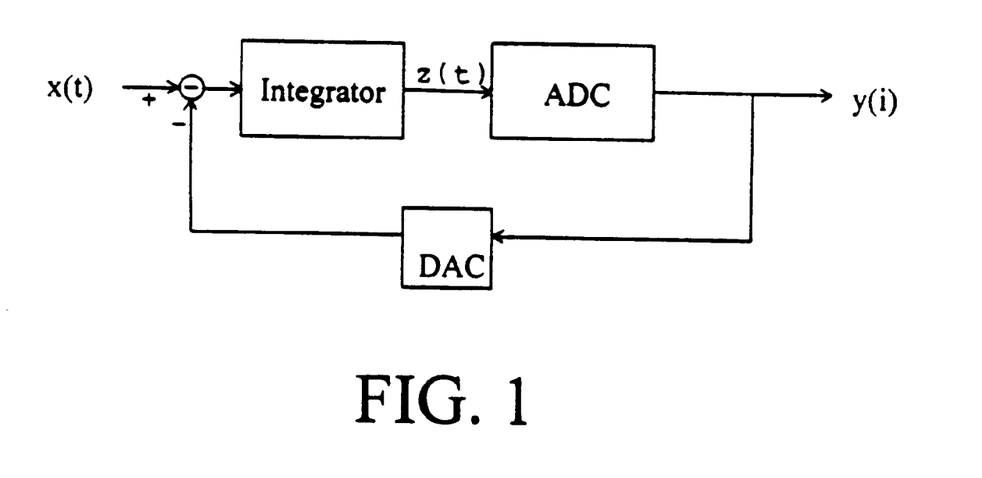
FIG. 1 is a block diagram of an available first-order sigma-delta modulator.

Referring to the accompanying figures, FIG. 1 illustrates the standard topology for a sigma-delta analog-to-digital converter. It incorporates a low order analog-to-digital converter (ADC) to generate an output bitstream Y. This bitstream is applied to a digital decimation filter to produce the final digital output. Bitstream Y is also applied as feedback to a digital-to-analog converter (DAC) which adjusts the subsequent output, $Y_{(l+1)}$, based upon the bitstream value $Y_{(l)}$. The ADC is normally a single-bit device wherein a single comparator receives the analog input and produces a single-bit output. However, for high-order modulators, the single-bit comparator is susceptible to being overloaded. As the input signal increases, the loop gain begins to drop rapidly and the system becomes unstable.

Figure 2:
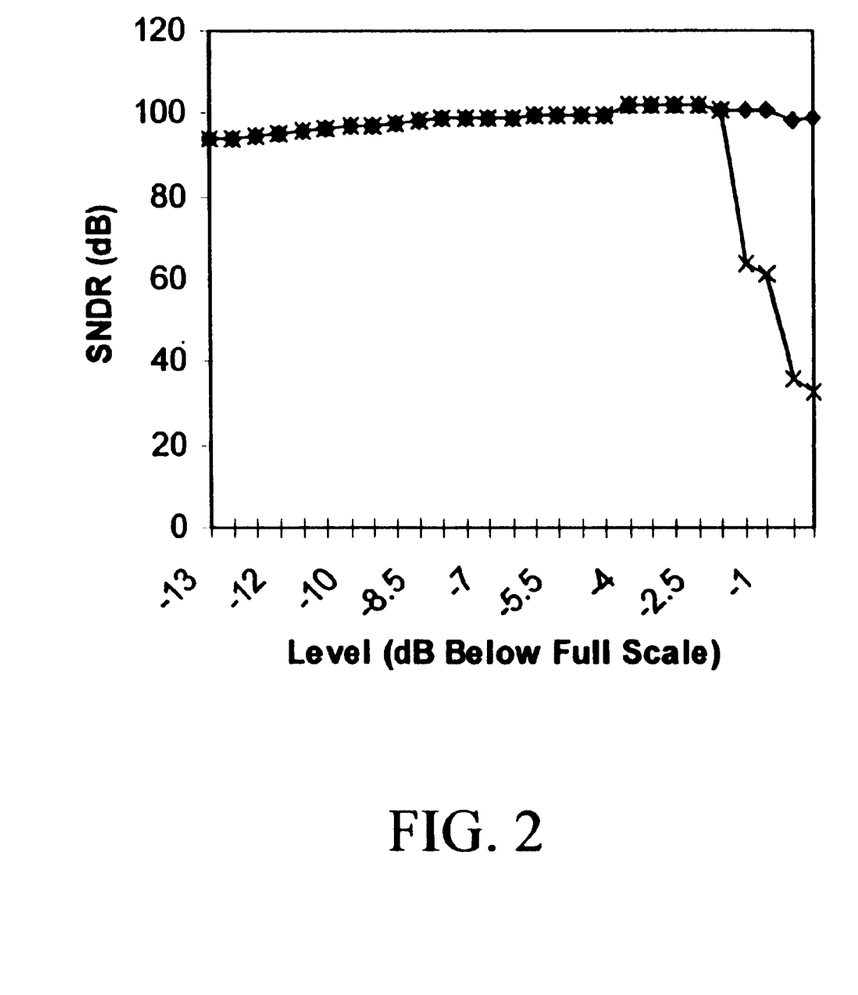
FIG. 2 is a graphical illustration of signal-to-noise ratio versus input signal level using conventional 1-bit and 2-bit converters.

FIG. 2 illustrates signal-to-noise ratio (SNR) versus input signal level for both conventional 1-bit and 2-bit digital-to-analog converters. As seen in FIG. 2, for signal levels up to about 2 dB below full scale, the signal-to-noise ratio of the 1-bit and 2-bit converters are comparable. However, at or about 2 dB below full scale and for higher signal levels, the SNR for the 1-bit converter decreases rapidly while the SNR for the 2-bit converter degrades gracefully.

The present invention is a unique implementation of a multi-bit converter providing effective 1-bit operation throughout most of the input signal range to exploit the simplicity and linearity of 1-bit operation, and including a triggering mechanism to invoke 2-bit operation whenever the input signal exceeds a normal operating range of the single-bit operation mode. In this manner, the invention produces the stable operation of a multi-bit converter while maintaining the simplicity and linearity of a one-bit converter over most of the input signal range.

Figure 3:
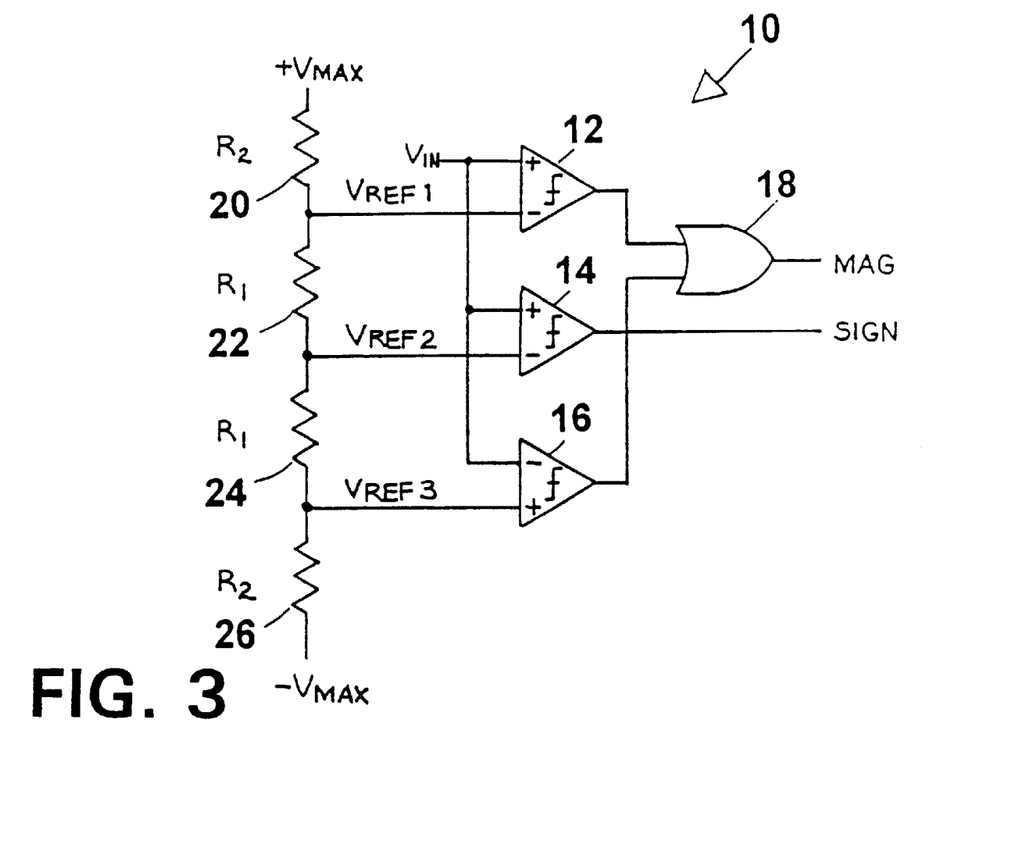
FIG. 3 is a simplified schematic diagram of a preferred comparator implementation of the present invention.

FIG. 3 illustrates the underlying implementation of the preferred embodiment of the invention in converter 10, including a 1-bit to 2-bit triggering mechanism. More specifically, circuit 10 comprises comparators 12, 14 and 16 and logic "OR" gate 18. Also included is a plurality of resistors 20, 22, 24 and 26 connected in series between a pair of stable voltage sources $+V_{max}$ and $-V_{max}$. These resistors provide the three reference voltages $V_{REF1}$, $V_{REF2}$ and $V_{REF3}$, which are applied as reference inputs to the comparators 12, 14 and 16, respectively. The second input to each of the comparators is the analog input signal $V_{in}$.

FIG. 3 illustrates a single-ended version but can be extended to a differential implementation. The output of this "Triple Comparator" is a two bit word. Under normal operation, the MAG bit would remain Low, thereby emulating a single-bit output as the sign bit functions as a conventional 1-bit ADC. When the MAG bit turns on (indicating an overload condition) the circuit acts as a 2-bit ADC. To implement the system, one would continually increase the input signal to the sigma-delta comparator with a 1-bit ADC. The level at which overload is detected is used to set the trip point for the extra two comparators.

Figure 4A:
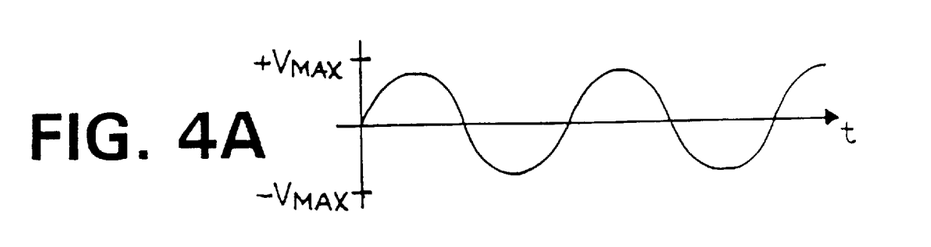
FIGS. 4A and 4B, illustrates respectively, a typical analog input signal and a graph of quantization levels in a 2-bit ADC.
Figure 4B:
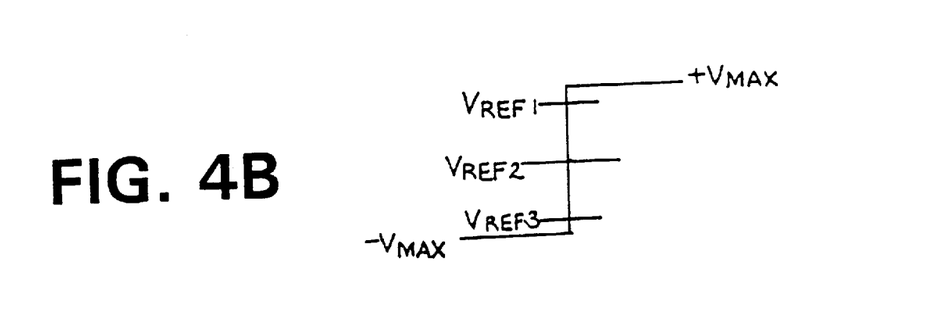

FIG. 4A is a graph of a typical analog input signal received as Vin in FIG. 3. One can see that the input signal is essentially a sine-wave having peak levels (positive and negative) between maxima $+V_{max}$ and $-V_{max}$. FIG. 4B illustrates the quantization of the input signal range into multi-bit levels using $V_{REF1}$, $V_{REF2}$ and $V_{REF3}$. As seen in FIG. 4B, $V_{REF2}$ is preferably at the halfway point between $+V_{max}$ and $-V_{max}$ and $V_{REF1}$ and $V_{REF3}$ are relatively close to $+V_{max}$ and $-V_{max}$, respectively.

Figure 5A:
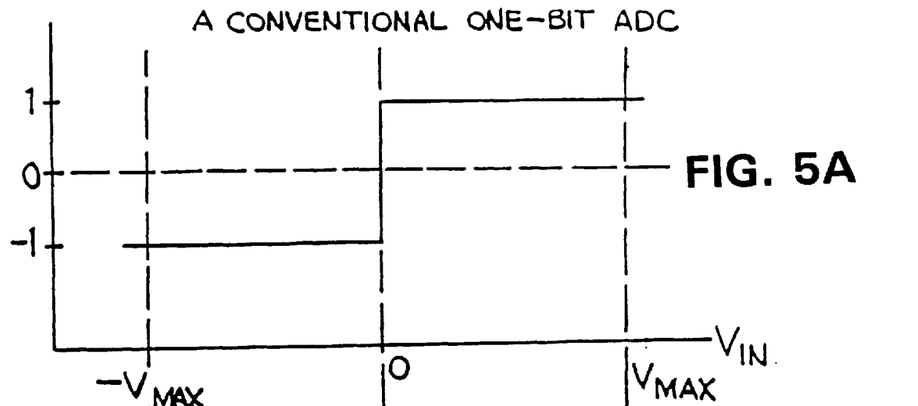
Figure 5B:
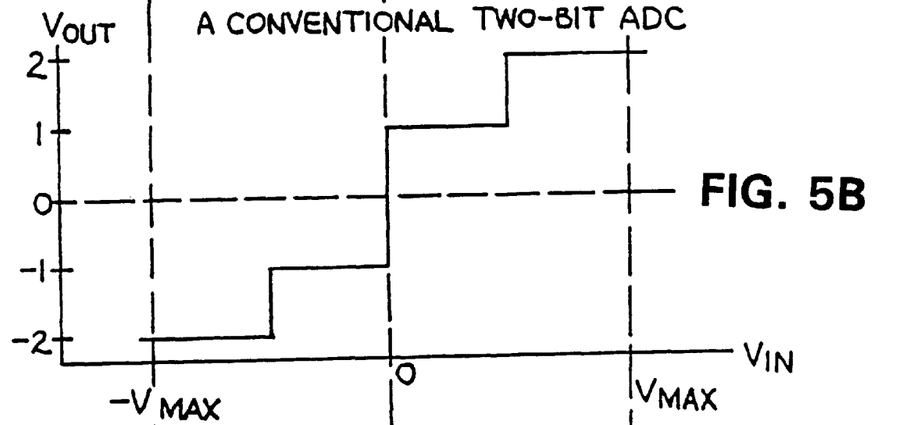
Figure 5C:
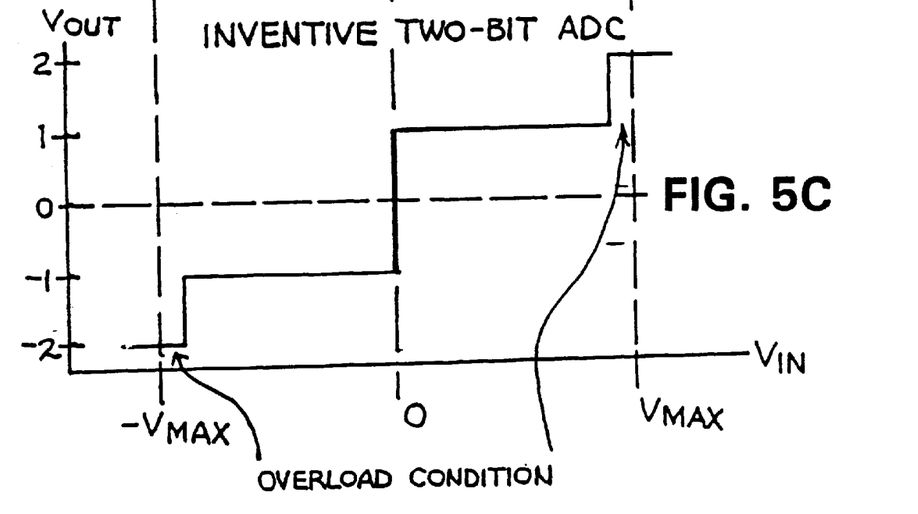

FIG. 5 illustrates the different forms of converter operation, contrasting the performance of the present invention in FIG. 5C with that of the available converters in FIGS. 5A and 5B. In FIG. 5A, a single-bit ADC generates a +1 for input voltages between 0 and $+V_{max}$ and a −1 for input voltages between $-V_{max}$ and 0. In a conventional 2-bit converter, as shown in FIG. 5B, the converter generates a +1 for input voltages between 0 and +½ $V_{max}$ and +2 for input voltages between ½ $V_{max}$ and $V_{max}$. The negative side of 0 is the mirror image of the positive side with −1 generated for input voltages between 0 and −½ $V_{max}$ and −2 generated for input voltages between −½ $V_{max}$ and $-V_{max}$.

FIG. 5C illustrates converter operation using the preferred comparator and multi-bit trigger circuit implementation of FIG. 3. More specifically, unlike the 2-bit transition points of $\pm V_{max}$ in the conventional operation of FIG. 5B, the transition points in the operation of the inventive converter of FIG. 5C are preferably within about 90% of $+V_{max}$ and $-V_{max}$, respectively. The actual transition points depend upon where overload conditions begin for the particular circuit implemented. In fact, setting the values of $V_{REF1}$ and $V_{REF3}$ in FIG. 3 is best accomplished by noting where in the range of input signal levels the overload condition begins to occur, so that transition from 1-bit to multi-bit operation occurs at the highest possible level and 1-bit operation occurs over the vast majority of signal range.

Figure 6A:
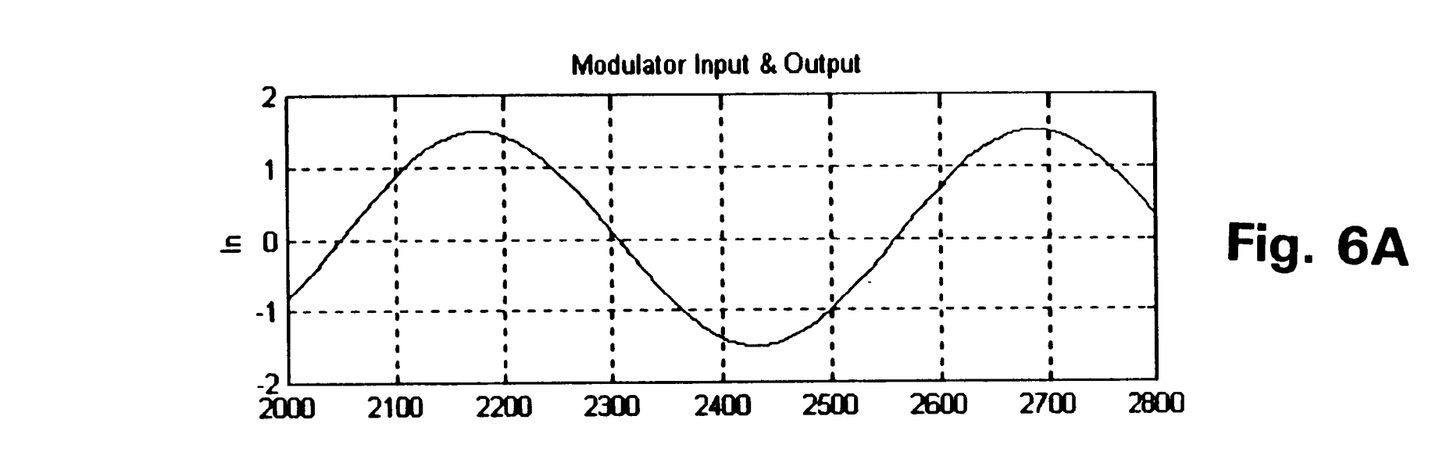
FIG. 6A illustrates an input applied to a conventional single-bit converter.
Figure 6B:
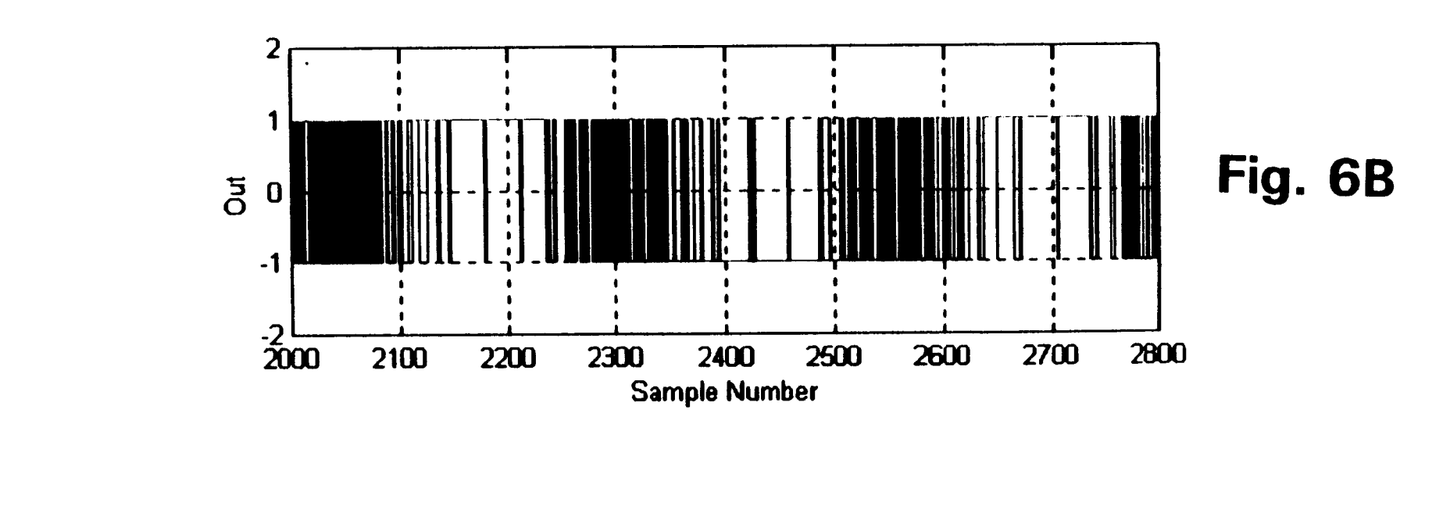
FIG. 6B illustrates the time domain simulation output for the input of FIG. 6A applied to the conventional single-bit converter.
Figure 7A:
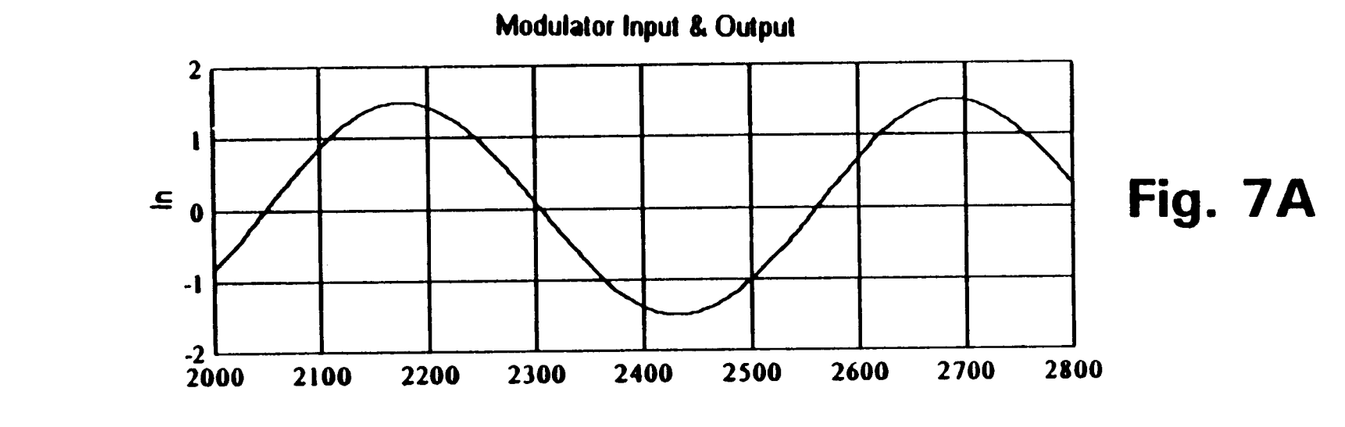
FIG. 7A illustrates an input applied to a preferred embodiment of the present invention.
Figure 7B:
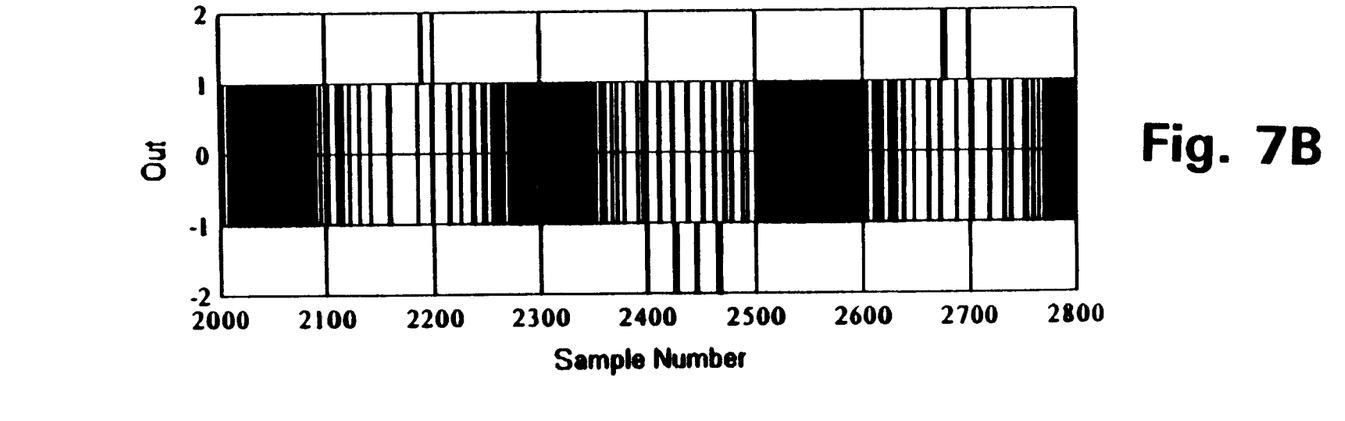
FIG. 7B illustrates the time domain simulation output for input of FIG. 7A applied to the preferred embodiment of the disclosed invention.
Figure 8A:
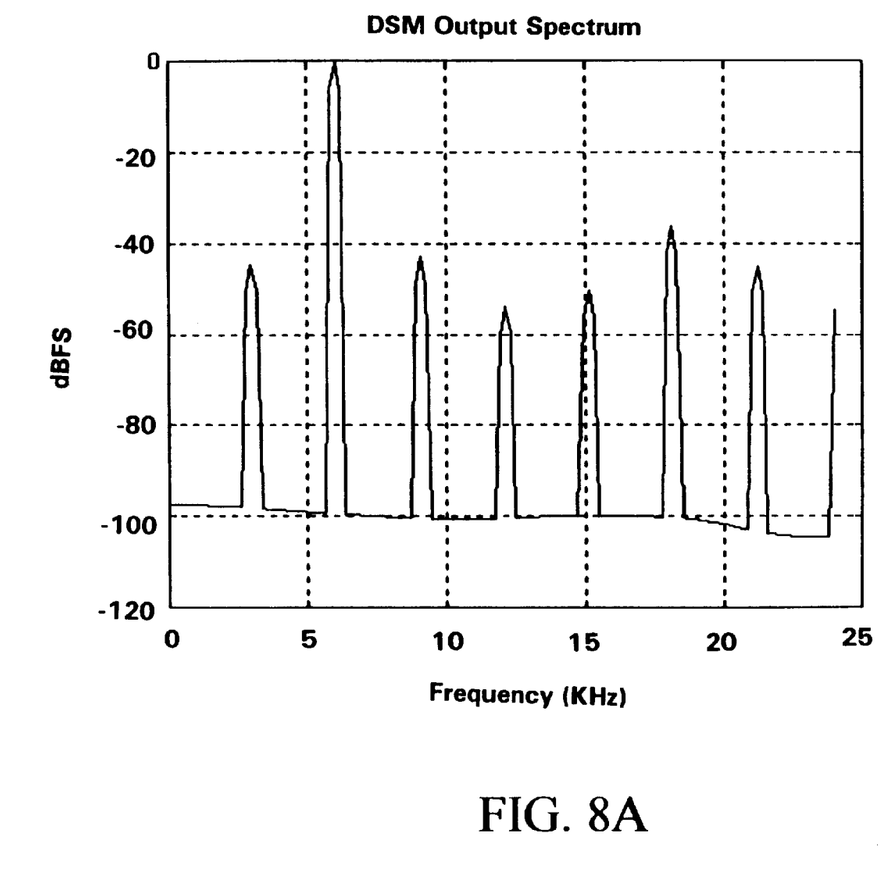
FIGS. 8A and 8B, illustrates frequency-domain simulation results for the single bit converter (FIG. 8A) and for the inventive converter (FIG. 8B).
Figure 8B:
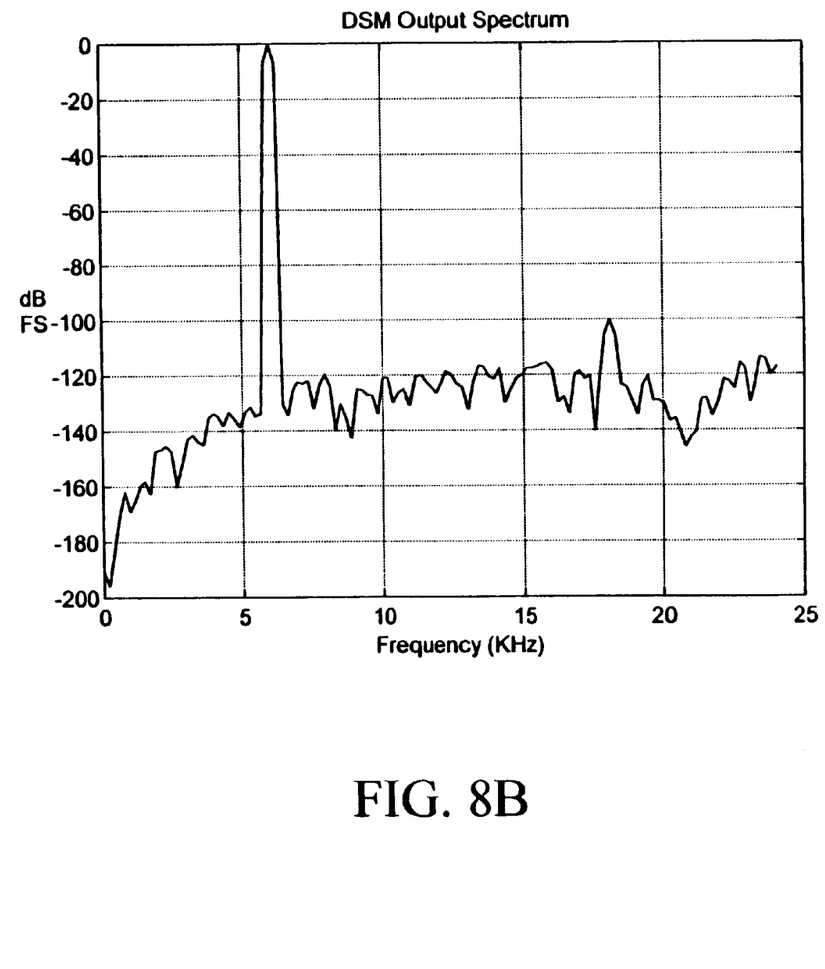

The improvement gained with the present invention as compared to a 1-bit converter may be further understood by the graphical results of simulations with an overloading signal level at −0.57 dB. The simulation results are shown in FIGS. 6, 7 and 8. FIG. 6 illustrates the time domain input signal (above) and output signal (below) for a single-bit converter. The illustrated oscillation sequences signify modulator overload. In contrast, FIG. 7 illustrates the time domain input signal (above) and output signal (below) for the inventive multi-bit converter, wherein triggering a second bit substantially protects the circuit from the overload condition illustrated in FIG. 6. FIG. 8, comprising FIGS. 8A and 8B, illustrates the frequency domain results of the single-bit converter and the inventive multi-bit converter, respectively. FIG. 8A shows that a large input signal induces significant performance loss in the single bit converter, while FIG. 8B shows that proper performance is maintained with the overload protection of the triggered second converter bit of the present invention.

Although the present invention has been shown and described with respect to preferred embodiments, various changes and modifications lie within the spirit and scope of the claimed invention. The corresponding structures, materials, acts, and equivalents of all means or step plus function elements in the claims are intended to include any structure, material, or acts for performing the functions in combination with other elements as specifically claimed.

What is claimed is:

1. An analog-to-digital converter having a sigma-delta configuration and providing both single-bit and multi-bit operation, the converter comprising:
    a plurality of single-bit comparators, each connected to receive an input analog signal Vin and a respective one of a plurality of reference signals, the value of each reference signal comprising a predetermined percentage of an anticipated maximum absolute value of Vin, at least one of said single-bit comparators providing a first digital output indicating whether Vin is above or below zero; and
    logic combining at least two of the outputs of the plurality of single-bit comparators and providing a second digital output signal indicating whether Vin is within a normal range or above the predetermined percentage of the anticipated maximum absolute value of Vin.

2. The apparatus recited in claim 1 wherein the predetermined percentage is greater than about 0.9.

3. The apparatus recited in claim 1 wherein the predetermined percentage is in the range of about 0.75 to 0.99.

4. The apparatus recited in claim 1 wherein the predetermined percentage is selected to substantially prevent an overload condition in said converter.

5. The apparatus recited in claim 1 wherein the predetermined percentage is selected to prevent an overload condition in said converter.

6. The apparatus recited in claim 1 wherein said apparatus causes said converter to operate as a single-bit converter for input analog signal magnitudes up to the predetermined percentage of the maximum, and to operate as a multi-bit converter for input analog signal magnitudes above the predetermined percentage of the maximum.

7. In a sigma-delta analog-to-digital converter for converting an analog input signal having a maximum absolute value $V_{max}$, into a digital representation of the signal level, a triggering apparatus comprising:
    a first comparator generating a first bit with a first logic state when the input signal is above a selected median level and with a second logic state when the input signal is below the selected median level;
    a second comparator generating a second bit with a first logic state when the input signal has an absolute value above a selected level between the selected median level and $V_{max}$ and with a second logic state when the input signal has an absolute value below the selected level.

8. The apparatus recited in claim 7 wherein the ratio of the selected level to $V_{max}$ is greater than 0.75.

9. The apparatus recited in claim 7 wherein the ratio of the selected level to said $V_{max}$ is greater than about 0.9.

10. The apparatus recited in claim 7 wherein said ratio is in the range of about 0.76 and 0.99.

11. The apparatus recited in claim 7 wherein the output signal of the second comparator is the second bit.

12. The apparatus recited in claim 7 further comprising a third comparator, the output signal of which is logically combined with the output of the second comparator to provide the second bit.

13. The apparatus recited in claim 7 wherein the selected level substantially prevents an overload condition in the analog-to-digital converter.

14. The apparatus recited in claim 7 wherein the selected level prevents an overload condition in the analog-to-digital converter.

15. A method for selecting a second output bit trigger level in a sigma-delta analog-to-digital converter, the converter having a plurality of comparators including a first comparator generating a first bit and a second comparator generating a second bit after an input analog signal to said analog-to-digital converter exceeds the trigger level; the method comprising the steps of:
    a) applying a simulated input analog signal to the converter;
    b) monitoring the condition of the converter while increasing the magnitude of the simulated input analog signal;
    c) noting the magnitude of the simulated input analog signal when the converter condition begins to reach overload; and
    d) setting the trigger level in a manner based upon the magnitude of the simulated input analog signal noted in step c).

16. The method recited in claim 15, wherein the converter is mathematically simulated in steps b) and c).

17. In an analog-to-digital converter having a sigma-delta configuration including an integrator receiving an analog input signal having maximum levels $+V_{max}$ and $-V_{max}$ and at least one comparator element having a first scale reference to generate a first digital bit in a manner dependent upon whether the magnitude of the analog input signal is above or below the first scale reference, the apparatus comprising:
    a second comparator element having a second scale reference distinct from the first scale reference, and configured to generate a second digital bit in a manner dependent upon the absolute value of the analog input signal exceeding a selected fraction of $\pm V_{max}$, the selected fraction being greater than 0.5.

18. A highly stable analog-to-digital converter having a sigma-delta configuration, the converter comprising:
    an integrator; and
    a multi-bit comparator element including:
        receiving means to receive from the integrator an input signal having a maximum magnitude;
        first output bit generating means to generate a first bit in a manner dependent upon whether the magnitude of the input signal is above or below a first reference; and second output bit generating means to generate a second bit in a manner dependant upon whether the magnitude of the input signal exceeds a second reference which corresponds to a selected fraction of the maximum magnitude.

19. The converter of claim 18, wherein the selected fraction is at least one of 0.5, 0.9, 0.75 to 0.99, and 0.5 to 0.9.

20. An analog-to-digital converter having two one-bit outputs, a first of said outputs being active for all input analog signals, a second of said outputs becoming active only for all input analog signals at or above a selected overload threshold; the converter comprising:

a first comparator for comparing said input analog signals with a first reference level for generating said first output;

a second comparator for comparing said input analog signals with a second reference level for generating said second output;

said first reference signal corresponding to a median value of said input analog signals; and said second reference signal corresponding to said selected overload threshold.

* * * * *